United States Patent
Cheng et al.

(10) Patent No.: US 12,349,512 B2
(45) Date of Patent: Jul. 1, 2025

(54) LIGHT-EMITTING DEVICE, TEMPLATE OF LIGHT-EMITTING DEVICE AND PREPARATION METHODS THEREOF

(71) Applicant: ENKRIS SEMICONDUCTOR, INC., Suzhou (CN)

(72) Inventors: Kai Cheng, Suzhou (CN); Liyang Zhang, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 635 days.

(21) Appl. No.: 17/555,916

(22) Filed: Dec. 20, 2021

(65) Prior Publication Data

US 2022/0115561 A1   Apr. 14, 2022

Related U.S. Application Data

(63) Continuation of application No. PCT/CN2019/092785, filed on Jun. 25, 2019.

(51) Int. Cl.
  *H10H 20/825*   (2025.01)
  *H01L 25/075*   (2006.01)
  *H10H 20/01*   (2025.01)

(52) U.S. Cl.
  CPC ....... *H10H 20/825* (2025.01); *H01L 25/0753* (2013.01); *H10H 20/0137* (2025.01)

(58) Field of Classification Search
  CPC ....................................................... H01L 33/32
  See application file for complete search history.

(56) References Cited

U.S. PATENT DOCUMENTS

| | | | |
|---|---|---|---|
| 2004/0087051 A1 | 5/2004 | Furuya et al. | |
| 2004/0219702 A1 | 11/2004 | Nagai et al. | |
| 2009/0072250 A1* | 3/2009 | Inoue | H01L 25/0753 257/E33.067 |
| 2010/0289041 A1 | 11/2010 | Shakuda | |
| 2011/0037098 A1 | 2/2011 | Kim et al. | |

(Continued)

FOREIGN PATENT DOCUMENTS

| | | |
|---|---|---|
| CN | 1221205 A | 6/1999 |
| CN | 101494267 A | 7/2009 |
| CN | 102037545 A | 4/2011 |

(Continued)

OTHER PUBLICATIONS

International Search Report issued in corresponding PCT Application No. PCT/CN2019/092785, dated Mar. 25, 2020.

(Continued)

*Primary Examiner* — Mohammad M Choudhry
(74) *Attorney, Agent, or Firm* — Westbridge IP LLC

(57) ABSTRACT

Disclosed are a light-emitting device, a template of the light-emitting device and preparation methods thereof. The template of the light-emitting device comprises a substrate; a GaN-based semiconductor layer and a mask layer provided on the substrate, where the mask layer comprises a plurality of mask openings provided at intervals, and the plurality of mask openings are filled with the GaN-based semiconductor layer; and a sacrificial layer provided on a surface of the GaN-based semiconductor layer away from the substrate and located in the plurality of mask openings provided at intervals.

8 Claims, 11 Drawing Sheets

(56) References Cited

U.S. PATENT DOCUMENTS

2016/0365485 A1 12/2016 Xu et al.
2017/0323999 A1 11/2017 Choi et al.

FOREIGN PATENT DOCUMENTS

| CN | 103403888 | A |   | 11/2013 |   |           |
|----|-----------|---|---|---------|---|-----------|
| CN | 105428471 | A |   |  3/2016 |   |           |
| CN | 107369746 | A |   | 11/2017 |   |           |
| CN | 107833954 | A |   |  3/2018 |   |           |
| CN | 108649046 | A |   | 10/2018 |   |           |
| EP |   1104031 | A2|   |  5/2001 |   |           |
| FR |   2936904 | A1| * |  4/2010 | ......... | H01L 21/0254 |
| KR | 20080097938 | A | * | 11/2008 |   |           |
| TW |  200828623 | A |   |  7/2008 |   |           |
| TW |  201424039 | A | * |  6/2014 | ........... | H01L 27/156 |
| TW |  201826491 | A |   |  7/2018 |   |           |

OTHER PUBLICATIONS

Written Opinion issued in corresponding PCT Application No. PCT/CN2019/092785, dated Mar. 25, 2020.
First Office Action issued in counterpart Chinese Patent Application No. 201980097776.0, dated Sep. 25, 2024.

\* cited by examiner

LIGHT-EMITTING DEVICE, TEMPLATE OF LIGHT-EMITTING DEVICE AND PREPARATION METHODS THEREOF

CROSS-REFERENCE TO RELATED APPLICATIONS

This application is a continuation of International Application No. PCT/CN2019/092785, filed on Jun. 25, 2019, the entire contents of which are incorporated herein by reference.

TECHNICAL FIELD

This application relates to the field of light-emitting diode devices, and in particular to a light-emitting device structure, a template of a light-emitting device, and preparation methods thereof.

BACKGROUND

Traditional display technologies include liquid crystal displays (LCDs) and organic light-emitting diodes (OLEDs). However, LCDs have low efficiency, and OLEDs have life and reliability issues. A micro-LED is the miniaturization and matrixing technology for LED. Integrating a high-density and small-sized LED array on a chip makes its volume approximately 1% of the size of a current mainstream LED.

Micro-LEDs have characteristics of high efficiency, high brightness, high reliability and fast response time as of LEDs, but the power consumption thereof is as low as only 10% of LCDs and the saturation thereof is close to that of OLEDs, thereby being regarded as a perfect application of the next generation display technology. Compared with an OLED, which is also self-luminous, a micro-LED has 30 times higher brightness and a resolution of up to 1500 PPI, and the color thereof is easier to debug than an OLED. A micro-LED also has a longer service life than an OLED.

The micro-LED production and preparation chain could be simplified to epitaxial growth, chip processing, pixel transfer, inspection and repair, full color, and driving. The current low production yield rate and high manufacturing cost are the bottlenecks hindering the development of micro-LEDs.

The main factors leading to a low production yield rate include:
1. in terms of epitaxy: small wafer size and low transfer efficiency; large warpage, which affects subsequent chip processing; poor wavelength uniformity, requiring core particles to be sorted, which is of high cost;
2. chip processing: due to the small size of the core particles, the non-radiative recombination of the sidewall of light-emitting units caused by etching increases, resulting in low luminous efficiency;
3. pixel transfer: the traditional "fetch" and "release" methods are used to transfer the core particles to the drive backplane, which takes a long time to prepare therefore does not meet the requirements of industrialization;
4. detection and repair: there are many defective pixels, the workload of detection and repair is large, and the production cost is high; and
5. full color: RGB tri-color LED is used, which is costly.

SUMMARY

In view of this, the embodiments of this application are dedicated to providing a light-emitting device structure, a light-emitting device template structure, and a corresponding preparation method, which solves the above-mentioned problems of high cost and low luminous efficiency in the process of preparing the micro-LED.

Based on an aspect of this application, a template of a light-emitting device according to an embodiment of this application comprises:
  a substrate;
  a GaN-based semiconductor layer and a mask layer provided on the substrate, wherein the mask layer comprises a plurality of mask openings provided at intervals, and the plurality of mask openings are filled with the GaN-based semiconductor layer; and
  a sacrificial layer provided on a surface of the GaN-based semiconductor layer away from the substrate and located in the plurality of mask openings provided at intervals.

In one embodiment, the sacrificial layer comprises a plurality of hole structures.

In one embodiment, the GaN-based semiconductor layer are further disposed between the substrate and the mask player.

In one embodiment, a height of a side of the sacrificial layer away from the substrate is not higher than a height of a side of the mask layer away from the substrate.

In one embodiment, a width of each mask opening of the plurality of mask openings is not greater than 300 microns.

In one embodiment, a transverse cross-sectional shape of the plurality of mask openings comprises a combination of any one or more of the following shapes: hexagon, circle, triangle, rhombus, and rectangle.

In one embodiment, a material of the mask layer comprises a combination of any one or two of the following materials: silicon dioxide and silicon nitride.

Based on another aspect of this application, a light-emitting device according to an embodiment of this application comprises:
  a template for preparing a plurality of light-emitting units;
  the plurality of light-emitting units prepared on the template at intervals;
  where the template for preparing the plurality of light-emitting units comprises the template of the light-emitting device as mentioned above, and each of the light-emitting units is formed on one of the plurality of mask openings.

In one embodiment, a minimum width of each light-emitting unit of the plurality of light-emitting units along an arrangement direction is not greater than 300 microns.

In one embodiment, a longitudinal cross-sectional shape of the plurality of light-emitting units comprises a combination of any one or more of the following shapes: rectangle, trapezoid, and triangle.

Based on another aspect of this application, a preparation method for a template of a light-emitting device according to an embodiment of this application comprises:
  preparing a mask layer on a substrate, wherein the mask layer comprises a plurality of mask openings provided at intervals;
  preparing a GaN-based semiconductor layer in the plurality of mask openings to fill the plurality of mask openings; and
  preparing a sacrificial layer on the GaN-based semiconductor layer in the plurality of mask openings.

In one embodiment, the preparing the sacrificial layer on the GaN-based semiconductor layer in the plurality of mask openings comprises injecting a corrosive gas through the GaN-based semiconductor layer in the plurality of mask openings to form the sacrificial layer.

In one embodiment, the preparing the sacrificial layer on the GaN-based semiconductor layer in the plurality of mask openings comprises etching the GaN-based semiconductor layer in the plurality of mask openings using in-situ monosilane to form the sacrificial layer with hole structures.

In one embodiment, the preparing the sacrificial layer on the GaN-based semiconductor layer in the plurality of mask openings comprises etching the GaN-based semiconductor using an electrochemical selective method to form the sacrificial layer with hole structures.

In one embodiment, the preparing the sacrificial layer on the GaN-based semiconductor layer in the plurality of mask openings further comprises controlling a size and an occupancy rate of the hole structures by adjusting a doping concentration of the GaN-based semiconductor layer.

Based on another aspect of this application, a preparation method for a light-emitting device provided in one embodiment of this application comprises:

preparing a template using the preparation method mentioned above; and preparing a plurality of light-emitting units provided at intervals on the mask layer and the sacrificial layer of the template, wherein each light-emitting unit of the plurality of light-emitting units is formed on a mask opening.

In one embodiment, each light-emitting unit of the plurality of light-emitting units comprise a first semiconductor layer, an active layer, a second semiconductor layer, an electrode, a mirror metal electrode, and an insulating layer.

In one embodiment, the plurality of light-emitting units are connected to a temporary carrier through electrode contact pads.

In one embodiment, after preparing the plurality of light-emitting units provided at intervals on the mask layer and the sacrificial layer of the template, the preparation method further comprises peeling off the plurality of light-emitting units from the mask layer and the GaN-based semiconductor layer.

In one embodiment, peeling off the plurality of light-emitting units from the mask layer and the GaN-based semiconductor layer comprises peeling off the plurality of light-emitting units from the mask layer and the GaN-based semiconductor layer by peeling off the sacrificial layer.

An embodiment of this application provides a template of a light-emitting device, in which a GaN-based semiconductor layer and a mask layer are sequentially provided on a substrate, where the mask layer comprises a plurality of mask openings provided at intervals, and the GaN-based semiconductor layer fills the plurality of mask openings. A sacrificial layer is provided on the surface of the GaN-based semiconductor layer in the plurality of mask openings provided at intervals. By using the plurality of mask openings provided at intervals, a plurality of light-emitting units can be directly formed at intervals on the template of the light-emitting device, avoiding sidewall etching, selective epitaxy, avoiding non-radiative recombination problems due to etching, and improving the light-emitting efficiency of light-emitting device, and the use of the sacrificial layer for etching and peeling can realize the reuse of the template and reduce the waste of materials.

DETAILED DESCRIPTION OF THE EMBODIMENTS

In order to make the objectives, technical means and advantages of this application clearer, this application will be further described in detail below with reference to the accompanying drawings.

Figure 1:
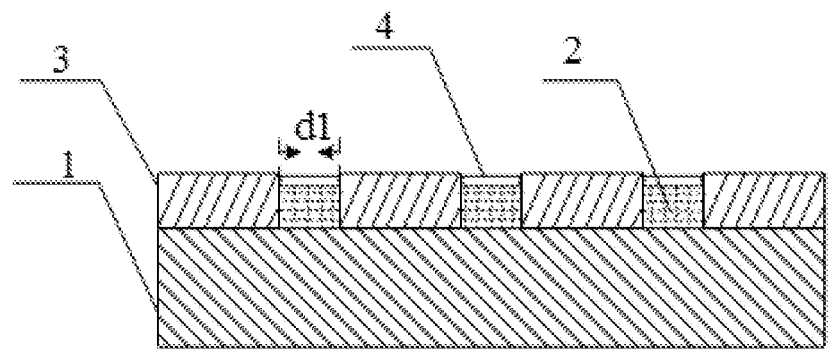
FIG. 1 is a schematic structural diagram of a template of a light-emitting device according to an embodiment of this application.

FIG. 1 is a schematic structural diagram of a template of a light-emitting device according to an embodiment of this application. As shown in FIG. 1, the template of the light-emitting device includes:

a substrate 1;

a GaN-based semiconductor layer 2 and a mask layer 3 provided on the substrate 1, where the mask layer 3 includes a plurality of mask openings provided at intervals, and the GaN-based semiconductor layer 2 fills the plurality of mask openings; and a sacrificial layer 4 provided on a surface of the GaN-based semiconductor layer 2 away from the substrate 1 and located in the plurality of mask openings provided at intervals.

By setting a template including the above-mentioned structure, the light-emitting device is prepared on the template, that is, the light-emitting device is prepared on the surface of the mask layer 3 and the sacrificial layer 4. By using the plurality of mask openings provided at intervals, the plurality of light-emitting units can be directly formed at intervals, which avoids sidewall etching and improves the light-emitting efficiency of the light-emitting device. Meanwhile using the sacrificial layer for etching and peeling can realize the reuse of the template and reduce the material waste and costs.

Figure 2:
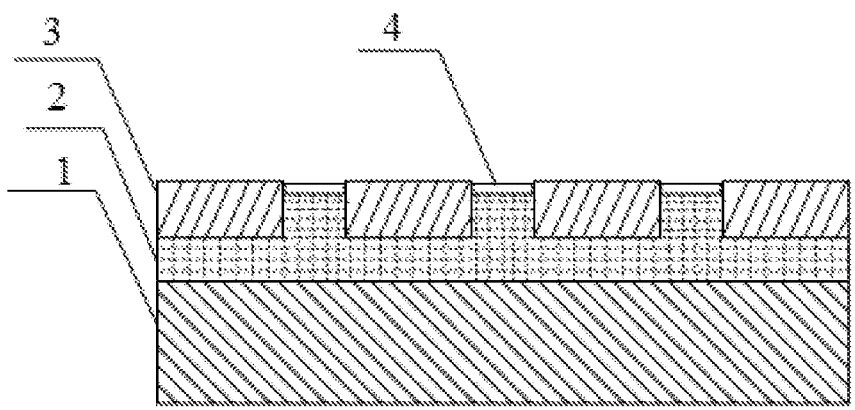
FIG. 2 is a schematic structural diagram of a template of a light-emitting device according to another embodiment of this application.

FIG. 2 is a schematic structural diagram of a template of a light-emitting device according to another embodiment of this application. As shown in FIG. 2, a GaN-based semiconductor layer 2 may be provided between a substrate 1 and a mask layer 3. By providing the GaN-based semiconductor layer between the substrate and the mask layer, and growing GaN-based material on GaN-based semiconductor layer in the plurality of mask openings, good quality GaN-based semiconductor layer is obtained to fill the plurality of mask openings.

Further, the template of the light-emitting device further includes a buffer layer provided between the substrate 1 and the GaN-based semiconductor layer 2.

In one embodiment, the height of a side of the sacrificial layer 4 away from the substrate 1 is not higher than the height of a side of the mask layer 3 away from the substrate 1 (as shown in FIG. 1), which facilitates the subsequent use of the sacrificial layer 4 to peel off the light-emitting template and the light-emitting device.

Figure 3:
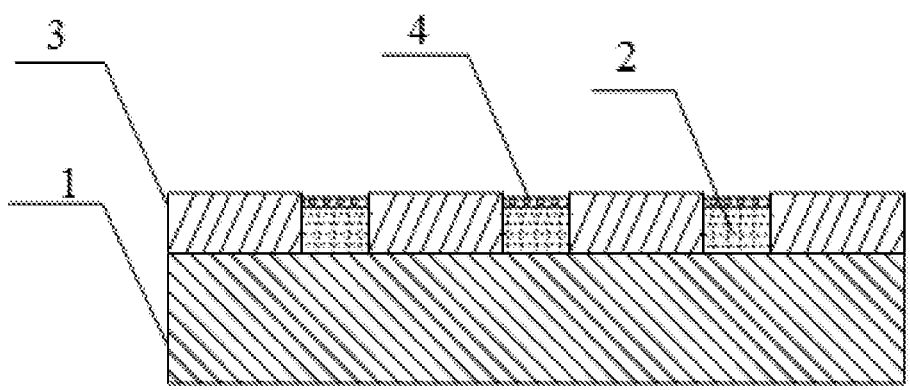
FIG. 3 is a schematic structural diagram of a template of a light-emitting device according to another embodiment of this application.

FIG. 3 is a schematic structural diagram of a template of a light-emitting device according to another embodiment of this application. As shown in FIG. 3, the sacrificial layer 4 may include a plurality of hole structures. By providing the plurality of hole structures, the peeling process after preparing the light-emitting device on the template is convenient. At the same time, due to the existence of the hole structures, the surface of the peeled light-emitting device in contact with the template will form a roughened surface, which improves the luminous efficiency of the light-emitting device. It should be understood that the embodiment of this application may choose whether to provide the hole structures on the sacrificial layer according to actual application scenarios, and the embodiment of this application does not limit whether hole structures are provided on the sacrificial layer. It should be understood that, in the embodiments of this application, the sacrificial layer may also be set as a defective structure or other structures that can facilitate the peeling of the light-emitting device and can form a roughened layer on the surface of the light-emitting device.

In one embodiment, the diameter of the plurality of hole structures may be less than 500 nanometers. It should be understood that in the embodiments of this application, the diameter of the hole structures can be selected according to the actual application scenario, as long as the diameter of the selected hole structures can facilitate the peeling of the light-emitting device and can form a roughened structure on the surface of the light-emitting device. The embodiments of this application do not limit the specific diameter of each hole structure of the hole structures.

Figure 4:
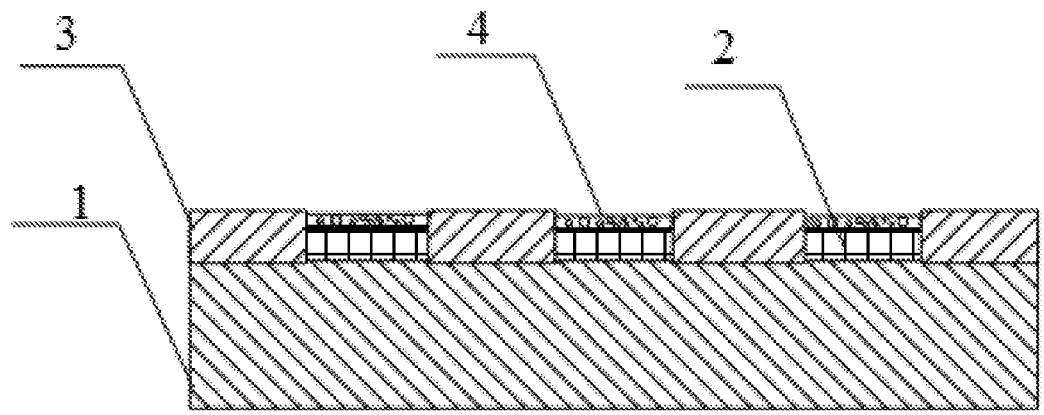
FIG. 4 is a schematic structural diagram of a template of a light-emitting device according to another embodiment of this application.

In one embodiment, the size and the shape of the plurality of hole structures may be inconsistent (as shown in FIG. 4). In one embodiment, the plurality of hole structures may be provided in a single layer (as shown in FIG. 3) or may be provided in multiple layers (as shown in FIG. 4). In one embodiment, the plurality of hole structures may be provided regularly (as shown in FIG. 3) or provided irregularly (as shown in FIG. 4). It should be understood that in the embodiments of this application, different sizes, shapes, and arrangements of the hole structures can be selected according to actual application scenarios, as long as the different sizes, shapes, and arrangements of the selected hole structures can facilitate the peeling of the light-emitting device and can form a roughened structure on the surface of the light-emitting device. The embodiments of this application do not limit the specific size, shape, and arrangement of the hole structures.

In one embodiment, the width of each mask opening may not be greater than 300 microns. According to the preparation requirements of the light-emitting device, the width of each mask opening can be set adaptively (d1 as shown in FIG. 1). According to the structure and the size of current commonly used micro-LEDs, the width of each mask opening can be set limited to not more than 300 microns. It should be understood that the width of each mask opening can be selected according to the actual application scenario in the embodiments of this application, as long as the width of the selected mask opening can meet the size requirement of the light-emitting device. The specific width of each mask opening is not limited in the embodiments of this application.

Figure 5A:
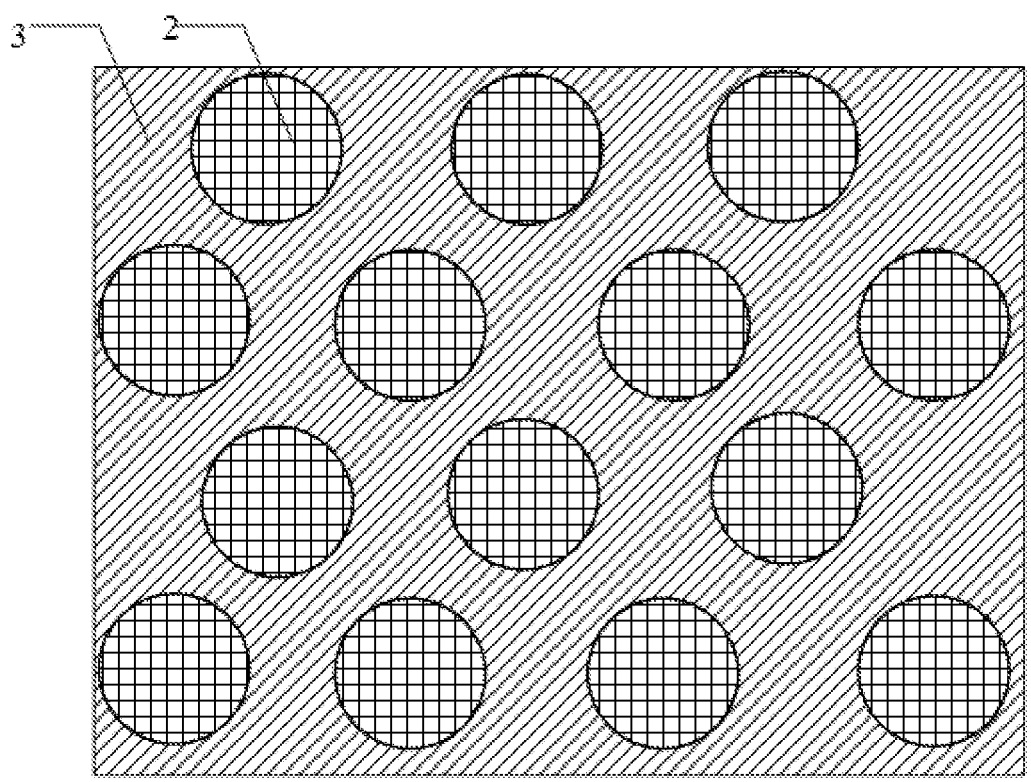
FIG. 5a is a schematic top view illustrating a structure of a template of a light-emitting device according to an embodiment of this application.
Figure 5B:
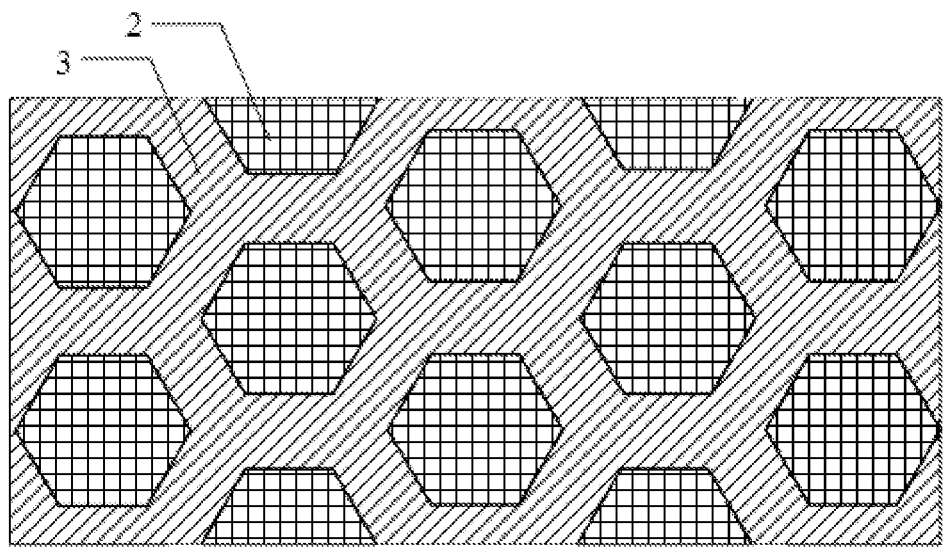
FIG. 5b is a schematic top view illustrating a structure of a template of a light-emitting device according to another embodiment of this application.
Figure 6:
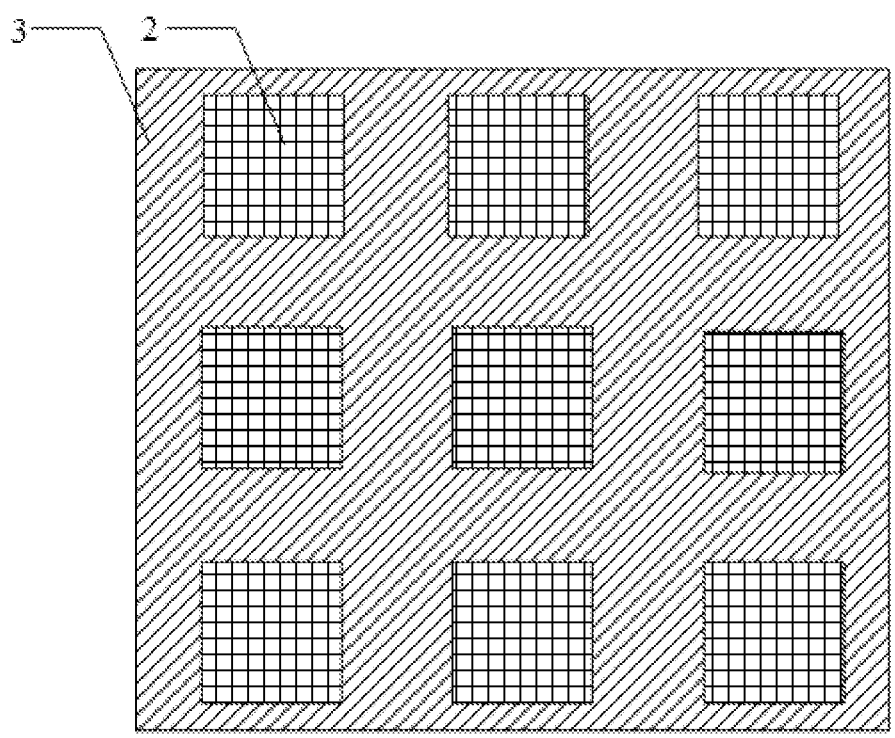
FIG. 6 is a schematic top view illustrating a structure of a template of a light-emitting device according to another embodiment of this application.
Figure 7:
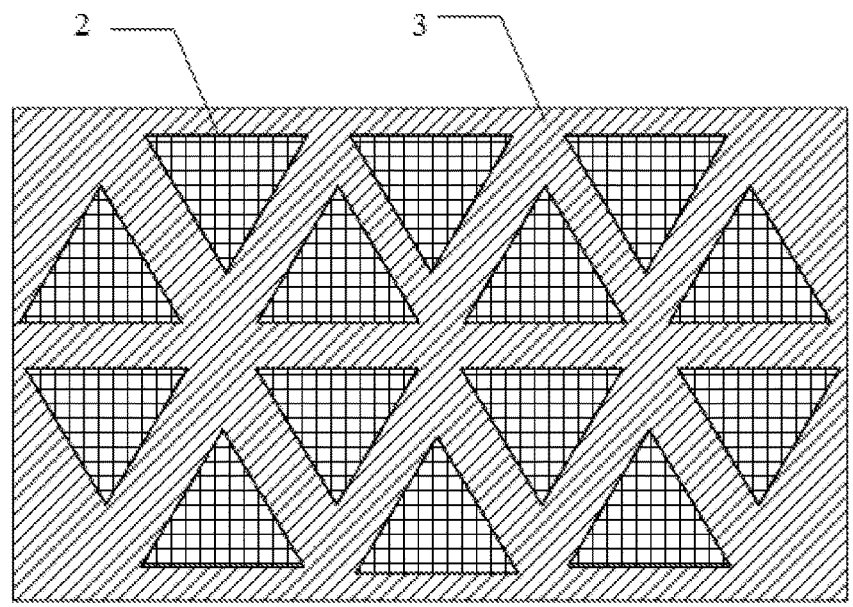
FIG. 7 is a schematic top view illustrating a structure of a template of a light-emitting device according to another embodiment of this application.

FIGS. 5a, 5b, 6, and 7 are respectively schematic top views illustrating structures of templates of a light-emitting device according to other embodiments of this application. As shown in FIGS. 5a, 5b, 6, and 7, the transverse (direction perpendicular to the stacking direction) cross-sectional shape of the plurality of mask openings can include any one or a combination of the following shapes: hexagon, circle and triangle, rhombus, and rectangle. Specifically, FIGS. 5a and 5b are respectively schematic top views of circle and hexagon; FIG. 6 is a schematic top view of rectangle; FIG.

7 is a schematic top view of a triangle. It should be understood that in the embodiments of this application, different shapes of the transverse section of the plurality of mask openings can be selected according to actual application scenarios, as long as the selected shape of the transverse section of the plurality of mask openings can meet the requirements of preparing the light-emitting device. The specific shape of the transverse section of the plurality of mask openings is not limited jn the embodiments of this application.

In one embodiment, the material of the mask layer 3 may include any one or a combination of two of the following materials: silicon dioxide and silicon nitride. The material of the mask layer 3 in the embodiment of this application may include only silicon dioxide, or only silicon nitride, or both silicon dioxide and silicon nitride. It should be understood that in the embodiments of this application, different materials of the mask layer 3 can be selected according to actual application scenarios, as long as the selected material of the mask layer 3 can meet the requirements of preparing the light-emitting device. The embodiments of this application are not limited to a specific material.

Figure 8:
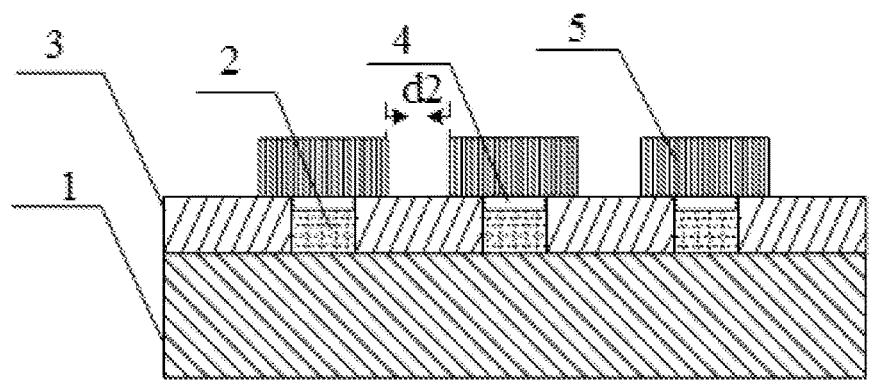
FIG. 8 is a schematic structural diagram of a light-emitting device according to an embodiment of this application.

FIG. 8 is a schematic structural diagram of a light-emitting device according to an embodiment of this application. As shown in FIG. 8, a light-emitting device includes a template for preparing a plurality of light-emitting units and a plurality of light-emitting units 5 prepared on the template, which are provided at intervals. The template may be any template of the light-emitting unit as described above, and each light-emitting unit 5 forms on one mask opening of the plurality of mask openings. The plurality of light-emitting units 5 are prepared on the template of the above structure, and the above-mentioned mask opening structure can be used to prepare the plurality of light-emitting units 5 directly on the plurality of mask openings (including the partial structure of the mask layer on both sides of the plurality of mask openings) and the surface of the sacrificial layer 4, so that the plurality of light-emitting units 5 are directly provided at intervals, which avoids sidewall etching for forming the plurality of light-emitting units 5, and thereby avoids the low luminous efficiency caused by serious non-radiative recombination. The peeling of the plurality of light-emitting units 5 from the template can be easily realized using the sacrificial layer 4, and the template after peeling can be reused to continuously form the light-emitting device on it, thereby avoiding the waste of materials and reducing the costs.

It should be understood that, in the embodiments of the light-emitting device of this application, the template used may be the template structure described in any one of the above-mentioned embodiments. Therefore, the light-emitting device in the embodiment of this application may have all technical features and technical effects in the embodiment implemented with the above-mentioned template structure.

In one embodiment, the minimum width of each light-emitting unit 5 along the arrangement direction may not be greater than 300 microns, preferably, the minimum width of each light-emitting unit 5 along the arrangement direction may not be greater than 50 microns. According to the preparation requirements of the light-emitting device, the minimum width between the plurality of light-emitting units may be adaptively provided during the preparation of the light-emitting device 5 (d2 as shown in FIG. 8). According to the structure and the size of the currently used micro-LEDs, the embodiment of this application limits the minimum width between adjacent light-emitting units 5 to no more than 300 microns. It should be understood that in the embodiments of this application, the minimum width between adjacent light-emitting units may be selected according to actual application scenarios, as long as the selected minimum width between the plurality of light-emitting units can meet the requirements of the light-emitting device, the specific value of the minimum width between the plurality of light-emitting units is not limited in the embodiments of this application.

Figure 9:
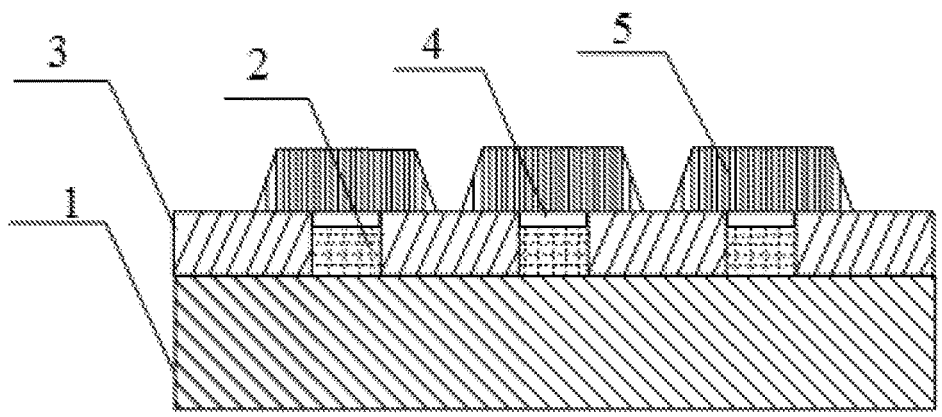
FIG. 9 is a schematic structural diagram of a light-emitting device according to another embodiment of this application.

In one embodiment, the longitudinal (stacking direction) cross-sectional shape of the plurality of light-emitting units 5 may include any one or a combination of the following shapes: rectangle (as shown in FIG. 8), trapezoid (as shown in FIG. 9), and triangle. It should be understood that in the embodiments of this application, different longitudinal cross-sectional shapes for the plurality of light-emitting units can be selected according to actual application scenarios, as long as the selected longitudinal cross-sectional shape of the plurality of light-emitting units can meet the needs of the light-emitting device. The specific shape of the longitudinal surface of the light-emitting device is not limited in the embodiments of this application.

Figure 10:
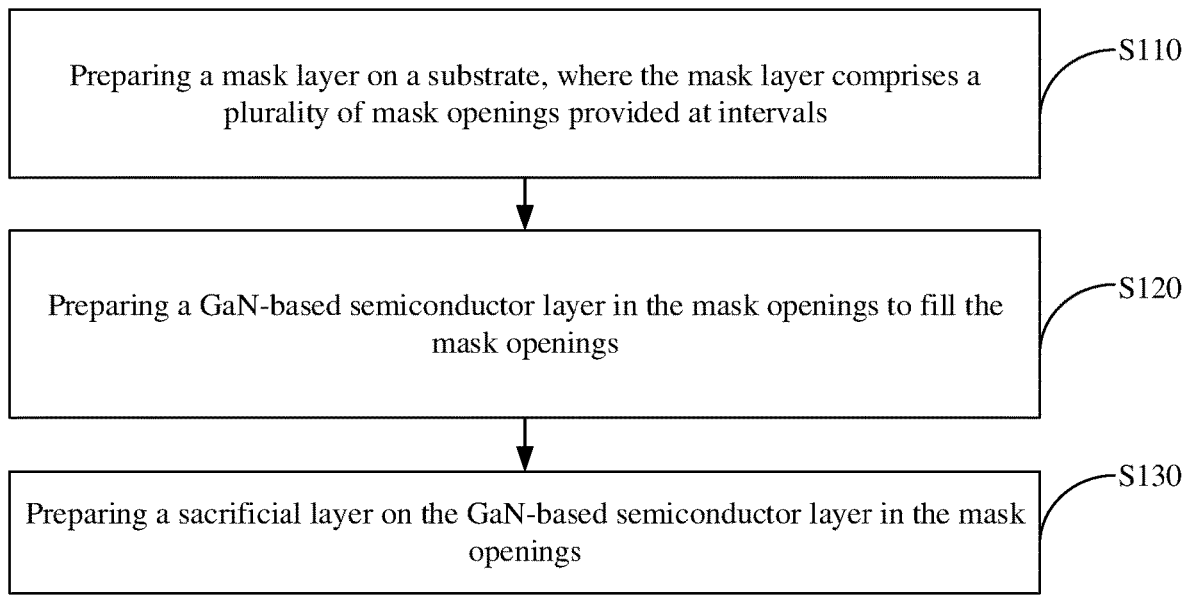
FIG. 10 is a flowchart of a preparation method for a template of a light-emitting device according to an embodiment of this application.

FIG. 10 is a flowchart of a preparation method for a template of a light-emitting device according to an embodiment of this application. As shown in FIG. 10, the method includes the following steps:

Step S110: preparing a mask layer 3 on a substrate 1, where the mask layer 3 includes a plurality of mask openings provided at intervals.

In one embodiment, the method for forming the plurality of mask openings may include: after the mask layer 3 is prepared, the plurality of openings is formed at intervals on the surface of the mask layer 3 by etching (for example, wet etching). Of course, in the embodiment of this application, other methods can be selected to form the plurality of mask openings provided at intervals on the mask layer. The specific method of forming the plurality of mask openings provided at intervals is not limited in the embodiments of this application.

The substrate 1 may be a structure obtained directly or by preparation.

In one embodiment, a GaN-based semiconductor layer 2 can be prepared between the substrate 1 and the mask layer 3. In a further embodiment, a buffer layer may be provided between the substrate 1 and the GaN-based semiconductor layer 2.

In one embodiment, the substrate 1 includes semiconductor materials, ceramic materials, and high polymer materials, preferably sapphire, silicon carbide, silicon, lithium niobate, silicon insulator (SOI), gallium nitride, and aluminum nitride. Further preferably, the substrate 1 uses Si materials. The Si substrate has large size and high transfer efficiency. It could be understood that the material for preparing the substrate 1 is not limited in this application.

Figure 11A:
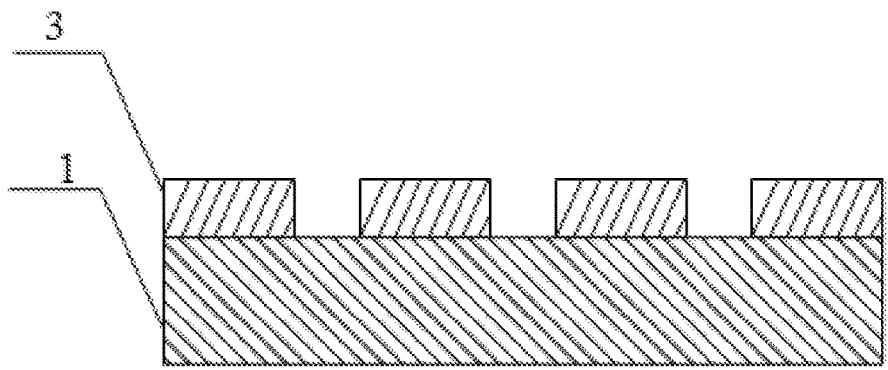
FIG. 11a is a schematic structural diagram during the preparation process of the template of the light-emitting device according to an embodiment of this application.

The plurality of mask openings are provided at intervals on the substrate 1 to form the mask layer 3 (as shown in FIG. 11*a*). By providing the plurality of mask openings at intervals, it is possible to directly prepare a plurality of light-emitting units at intervals on the plurality of mask openings, which avoids the process of obtaining the plurality of light-emitting units by sidewall etching after the entire structure is generated in the prior art, effectively improves the light-emitting efficiency of the plurality of light-emitting units, and can control the distance between adjacent light-emitting units by controlling the size of adjacent mask openings, so as to meet the different needs of light-emitting devices.

In this embodiment, the material of the mask layer 3 may include a combination of any one or two of the following materials: silicon dioxide and silicon nitride. It is understandable that the material of the mask layer 3 is not limited in this application, as long as the mask layer and the sacrificial layer can be peeled from the light-emitting structure device.

Step S120: preparing a GaN-based semiconductor layer 2 in the plurality of mask openings to fill the plurality of mask openings.

Figure 11B:
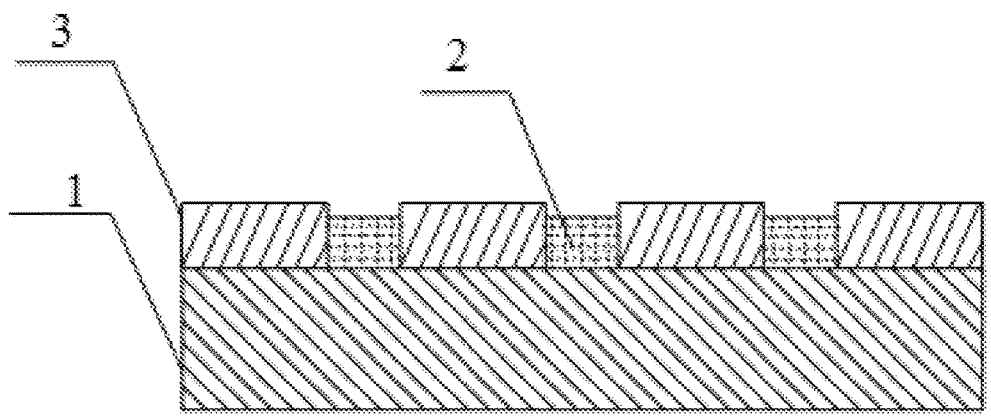
FIG. 11b is a schematic structural diagram during the preparation process of the template of the light-emitting device according to an embodiment of this application.

The GaN-based semiconductor layer 2 is prepared in the plurality of mask openings (as shown in FIG. 11*b*), that is, the GaN-based material is used to fill the plurality of mask openings. The so-called GaN-based material is a semiconductor material including at least Ga atoms and N atoms, such as GaN and AlGaN, InGaN, AlInGaN, etc.

Figure 11C:
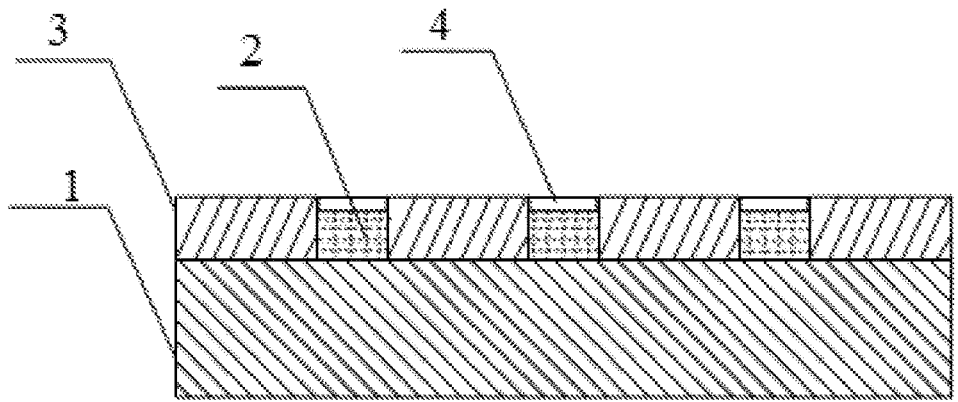
FIG. 11c is a schematic structural diagram during the preparation process of the template of the light-emitting device according to an embodiment of this application.

Step S130: preparing a sacrificial layer 4 on the GaN-based semiconductor layer 2 in the plurality of mask openings (as shown in FIG. 11*c*).

The sacrificial layer 4 is prepared on the GaN-based semiconductor layer 2 in the adjacent mask openings, that is, the sacrificial layer 4 is provided on the GaN-based semiconductor layer 2 and located in the plurality of mask openings. The plurality of light-emitting units are prepared on the sacrificial layer 4 and the plurality of mask openings. The peeling of the plurality of light-emitting units from the template can be easily realized using the sacrificial layer 4, and the template after peeling can be reused to avoid the waste of materials and reduce the costs.

In one embodiment, a specific implementing manner of preparing the sacrificial layer 4 on the GaN-based semiconductor layer 2 in the plurality of mask openings may include: injecting a corrosive gas on the GaN-based semiconductor layer 2 in the plurality of mask openings or etching the GaN-based semiconductor layer 2 in the mask openings by in-situ monosilane, or etching the GaN-based semiconductor layer 2 using an electrochemical selective method to form the sacrificial layer 4.

A sacrificial layer 4 with hole structures can be formed on the surface of the GaN-based semiconductor layer 2 by injecting a corrosive gas on the GaN-based semiconductor layer 2. The corrosive gas may include silane, disilane, hydrochloric acid, and the like. It should be understood that other corrosive gases may also be selected in the embodiments of this application to form the sacrificial layer 4 with hole structures on the surface of the GaN-based semiconductor layer 2.

Through any of the above methods, the sacrificial layer 4 with hole structures is formed on the surface of the GaN-based semiconductor layer 2. The peeling of the plurality of light-emitting units from the template can be easily realized using the sacrificial layer 4, and the template after peeling can be reused. In addition, the surface of the plurality of light-emitting units after peeling have their own roughening effect, which improves the luminous efficiency.

In one embodiment, the specific implementing method of preparing the sacrificial layer 4 on the GaN-based semiconductor layer 2 in the plurality of mask openings may also include electrochemical preparation. By controlling the preparation conditions, such as adjusting the magnitude of the bias voltage or adjusting the doping concentration of the GaN-based semiconductor layer 2, the purpose of adjusting the size and density of the holes can be achieved.

It should be understood that the n-type GaN and the corresponding impurity silicon listed in the embodiments of this application are only exemplary, and in the embodiments of this application, different concentration adjustment methods and corresponding doping impurities can be selected according to specific application scenarios. The specific concentration adjustment method and the corresponding doping impurities are not limited in the embodiments of this application.

Figure 12:
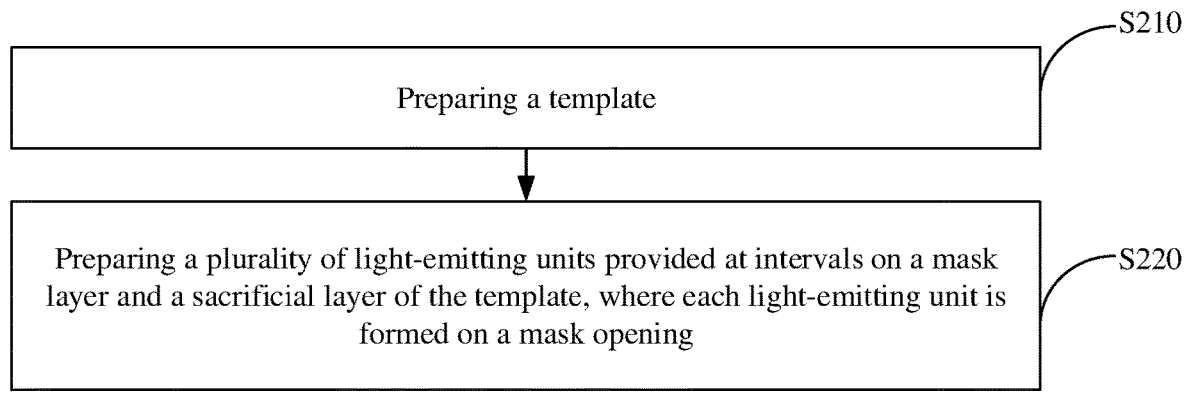
FIG. 12 is a flowchart of a preparation method for a light-emitting device according to an embodiment of this application.

FIG. 12 is a flowchart of a preparation method for a light-emitting device according to an embodiment of this application. As shown in FIG. 12, the method includes the following steps:

Step S210: preparing a template. Any one of the above-mentioned preparation methods can be used to prepare the template.

The template is prepared by any method in the above-described embodiments. A sacrificial layer is prepared on the GaN-based semiconductor layer in a plurality of mask openings, that is, the sacrificial layer is provided on the GaN-based semiconductor layer and is located in the plurality of mask openings, and a plurality of light-emitting units are prepared on the sacrificial layer and the plurality of mask openings. The peeling of the plurality of light-emitting units from the template can be easily realized using the sacrificial layer, and the template after peeling can be reused to avoid the waste of materials and reduce the costs.

Step S220: preparing a plurality of light-emitting units provided at intervals on the mask layer and the sacrificial layer of the template. Each light-emitting unit of the plurality of light-emitting units is formed on one mask opening of the plurality of mask openings.

A plurality of light-emitting units provided at intervals are prepared on the mask layer and sacrificial layer of the template. By providing the plurality of mask openings at intervals, it is possible to directly prepare the plurality of light-emitting units at intervals on the mask layer, which avoids the process of obtaining the plurality of light-emitting units by sidewall etching after the entire structure is generated in the prior art, effectively improves the light-emitting efficiency of the plurality of light-emitting units, and can control the distance between adjacent light-emitting units by controlling adjacent mask openings, so as to meet the different needs of light-emitting devices.

Figure 13:
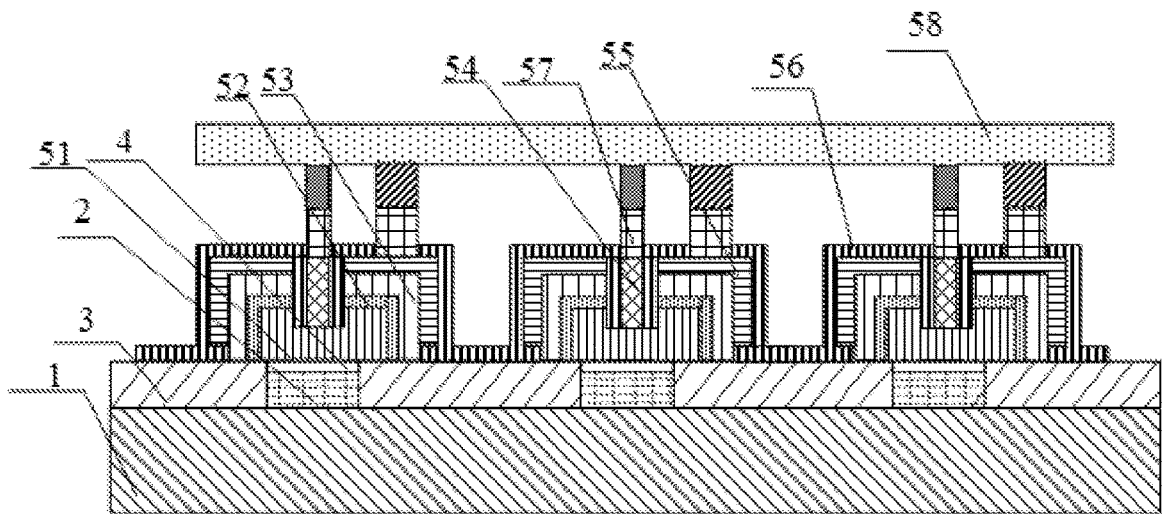
FIG. 13 is a schematic structural diagram of a light-emitting device according to another embodiment of this application.

FIG. 13 is a schematic structural diagram of a light-emitting device according to another embodiment of this application. As shown in FIG. 13, a light-emitting unit 5 may include a first semiconductor layer 51, an active layer 52, a second semiconductor layer 53, an electrode 54, a mirror metal electrode 55, and an insulating layer 56. The first semiconductor layer 51 may be an n-type semiconductor and the second semiconductor layer 53 is a p-type semiconductor; alternatively, the first semiconductor layer 51 is a p-type semiconductor and the second semiconductor layer 53 is an n-type semiconductor.

In one embodiment, preparing the plurality of light-emitting units may include the following processes.

Figure 14A:
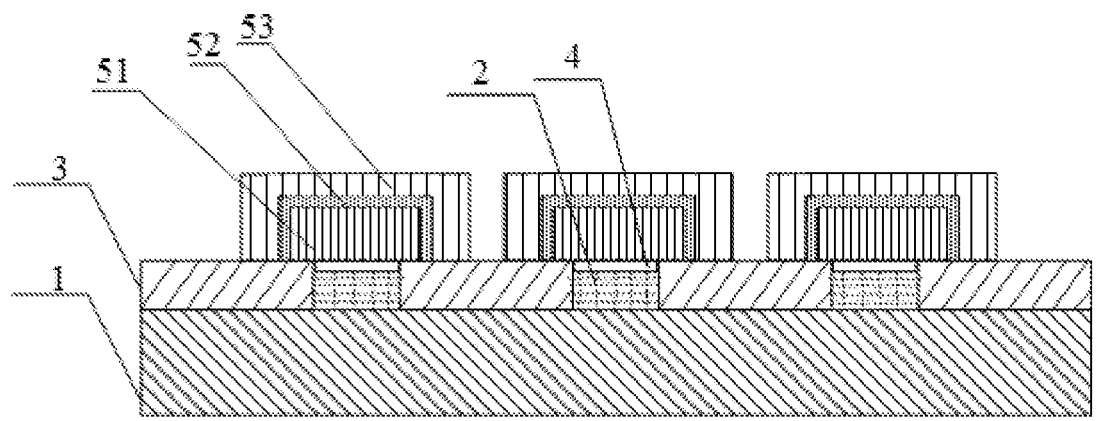
FIG. 14a is a schematic structural diagram of a light-emitting device during the preparation process according to an embodiment of this application.

As shown in FIG. 14*a*, the first semiconductor layer 51 is prepared on a mask layer 3 and a sacrificial layer 4; the active layer 52 is formed on the first semiconductor layer 51; and the second semiconductor layer 53 is formed on the active layer 52.

Figure 14B:
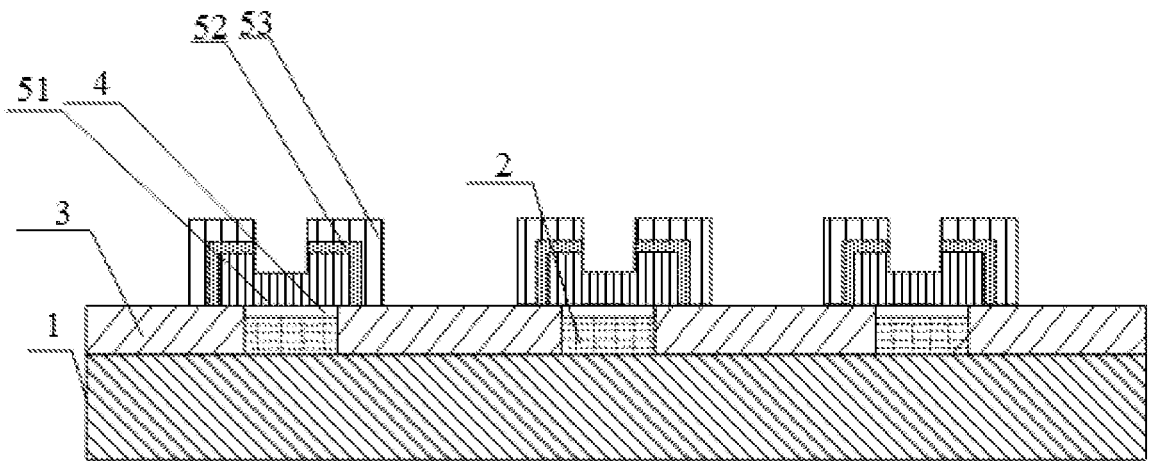
FIG. 14b is a schematic structural diagram of a light-emitting device during the preparation process according to an embodiment of this application.

As shown in FIG. 14*b*, a groove is etched from the side of the second semiconductor layer 53 away from the active layer 52. The groove penetrates the second semiconductor layer 53 and the active layer 52 and stops at the first semiconductor layer 51 or partially penetrates the first semiconductor layer 51. A photoresist is prepared on the mask layer 3 between the surface of the second semiconductor layer 53 that does not need to be etched and the plurality of light-emitting units 5 to protect the semiconductor covered by the photoresist.

Figure 14C:
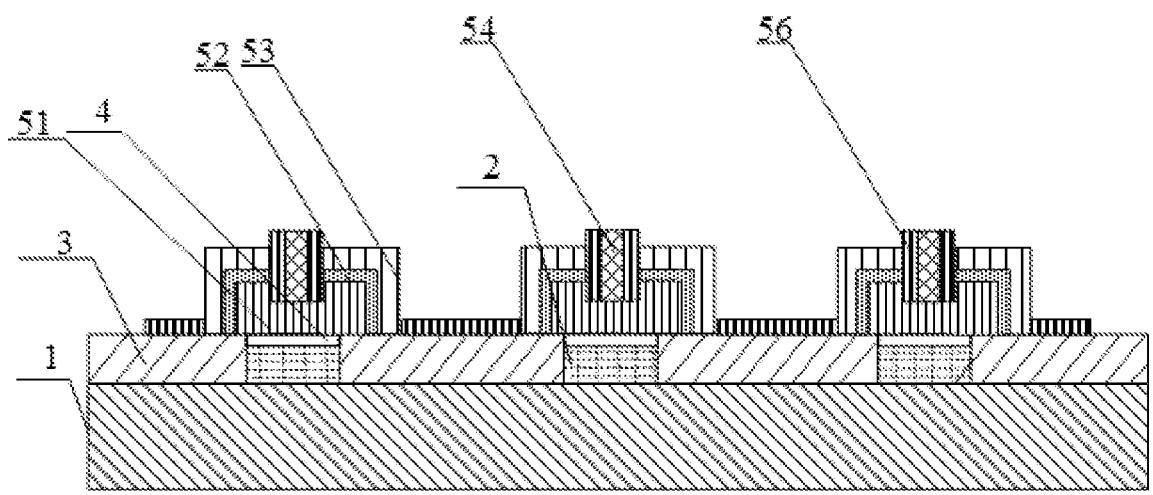
FIG. 14c is a schematic structural diagram of a light-emitting device during the preparation process according to an embodiment of this application.

As shown in FIG. 14*c*, after the etching is completed, the photoresist is removed and the insulating layer 56 is prepared on the sidewall of the groove and the mask layer 3 between the adjacent light-emitting units 5; and the electrode 54 is prepared in the groove. The electrode 54 is electrically connected to the first semiconductor layer 51, and the electrode 54 is insulated from the second semiconductor layer 53 and the active layer 52.

Figure 14D:
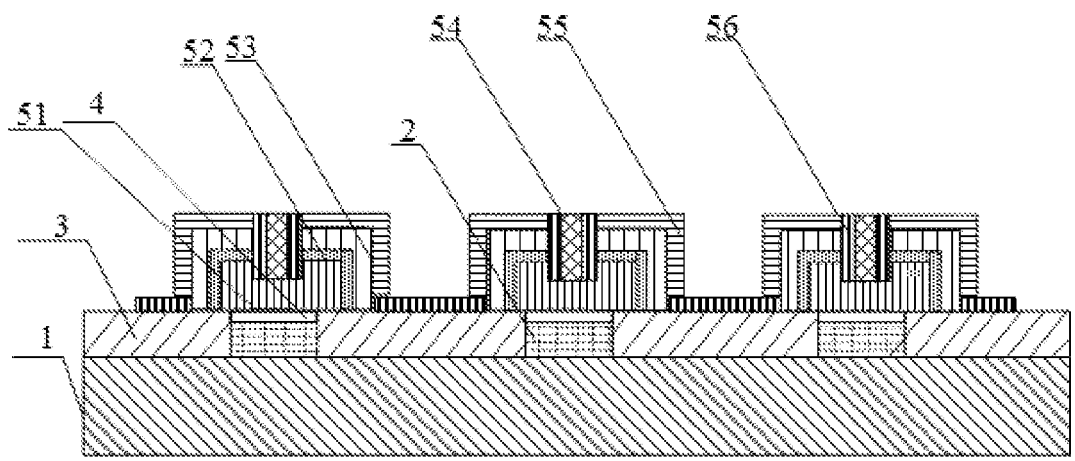
FIG. 14d is a schematic structural diagram of a light-emitting device during the preparation process according to an embodiment of this application.

As shown in FIG. 14*d*, the mirror metal electrode 55 is prepared on the second semiconductor layer 53. The mirror metal electrode 55 is electrically connected to the second semiconductor layer 53. There is an insulating layer between the mirror metal electrode 55 and the electrode 54, and between the mirror metal electrode 55 and the mask layer 3.

Figure 14E:
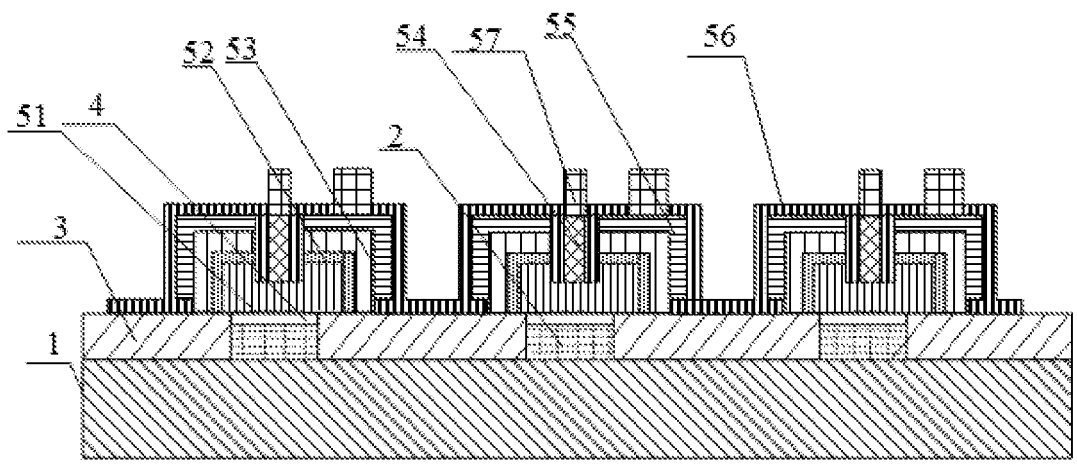
FIG. 14e is a schematic structural diagram of a light-emitting device during the preparation process according to an embodiment of this application.

In this embodiment, the light-emitting device further includes a plurality of light-emitting units connected to a temporary carrier through an electrode contact pad, and the temporary carrier includes a drive backplane and the like. Specifically, as shown in FIG. 14*e*, contact electrode pads 57 are prepared on the electrode 54 and the mirror metal electrode 55, and the insulating layer material is continued to be prepared between the parts of the mirror metal electrode 55 where the electrode contact pads 57 are not prepared on and the adjacent electrode contact pads 57. In this embodiment, the electrode contact pads 57 are respectively provided on the electrode 54 connected to the first semiconductor layer and on the mirror metal electrode 55 connected to the second semiconductor layer. The electrode 54 and the mirror metal electrode 55 are respectively connected to the temporary carrier through the electrode contact pad 57. The electrode contact pad 57 includes a metal material of silver, gold, copper, or aluminum or a multi-layer metal material combined with multiple metals.

Figure 14F:
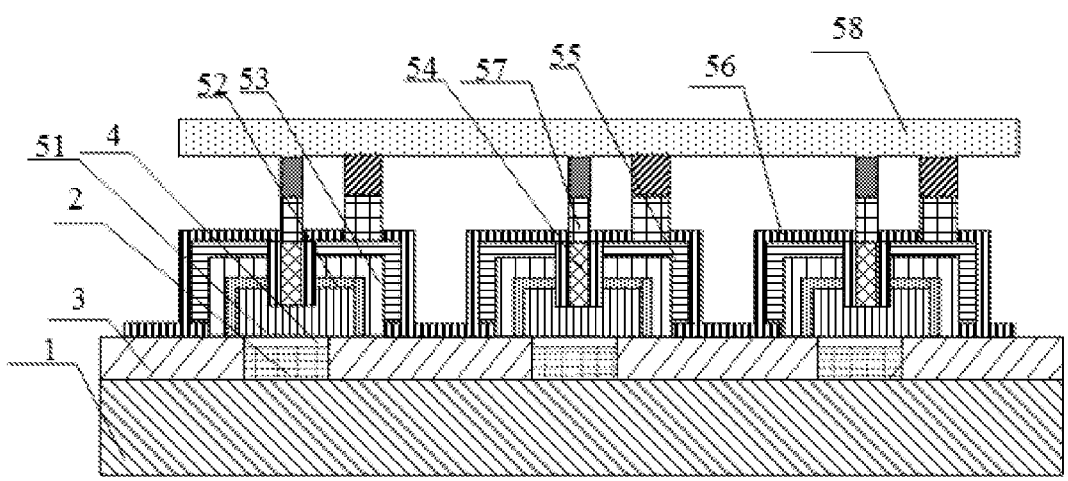
FIG. 14f is a schematic structural diagram of a light-emitting device during the preparation process according to an embodiment of this application.

As shown in FIG. 14*f*, a drive backplane 58 is provided on the electrode contact pads 57, and finally a light-emitting device structure is formed.

Figure 15:
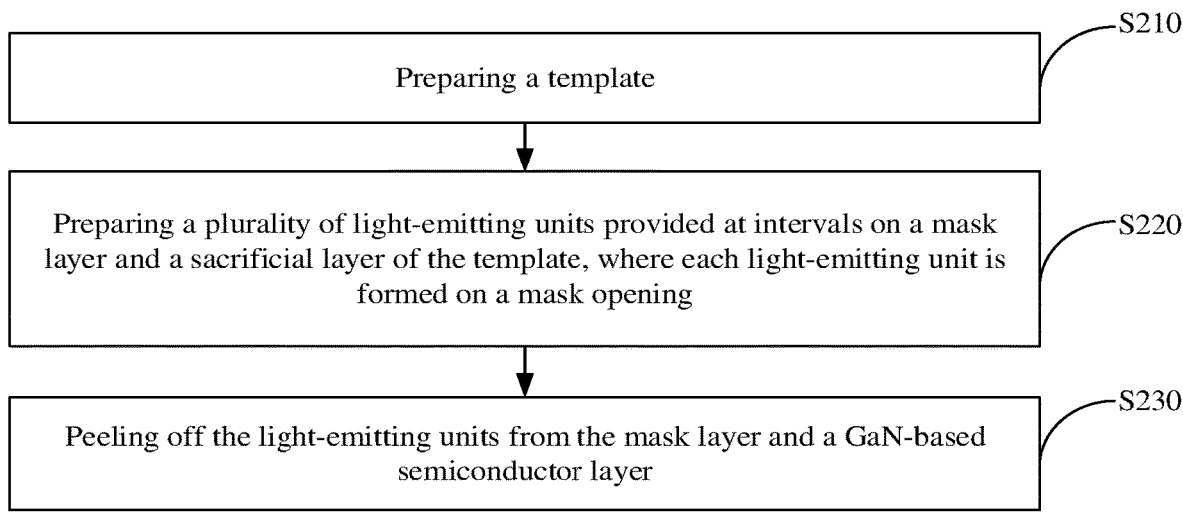
FIG. 15 is a flowchart of a preparation method for a light-emitting device according to another embodiment of this application.

FIG. 15 is a flowchart of a preparation method for a light-emitting device according to another embodiment of this application. As shown in FIG. 15, after step S220, the method may further include:

Step S230: peeling the plurality of light-emitting units from the mask layer and the GaN-based semiconductor layer.

By setting the sacrificial layer and preparing the light-emitting units on the sacrificial layer and the GaN-based semiconductor layer, when the plurality of light-emitting units are prepared, the sacrificial layer can be used to easily realize the peeling of the plurality of light-emitting units from the GaN-based semiconductor layer, and the peeled template can continue to be used to form the plurality of light-emitting units thereon and reuse it to avoid the waste of materials and reduce the costs.

Figure 16:
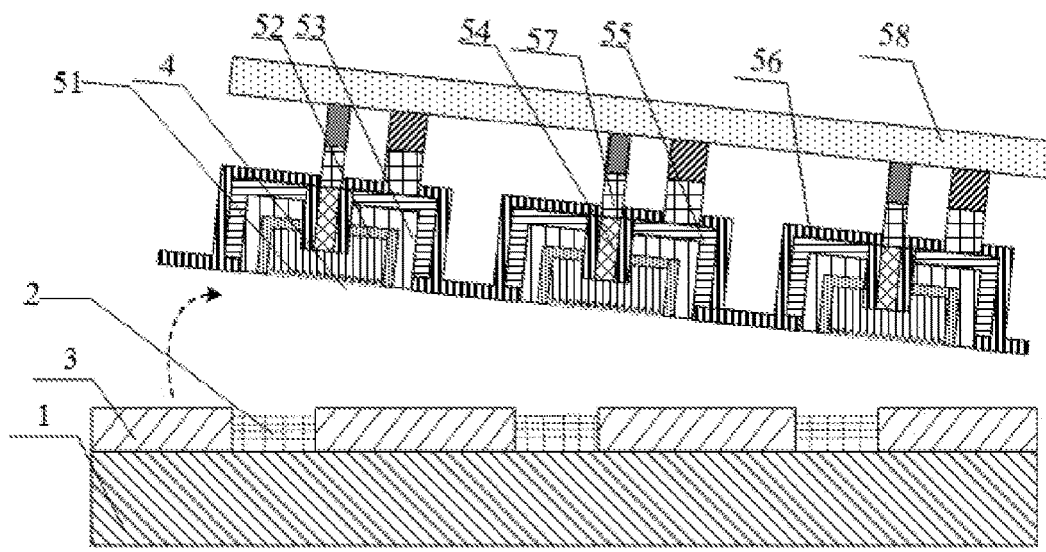
FIG. 16 is a schematic structural diagram showing when the light-emitting device is peeled off the template of the light-emitting device according to this application.
Figure 17:
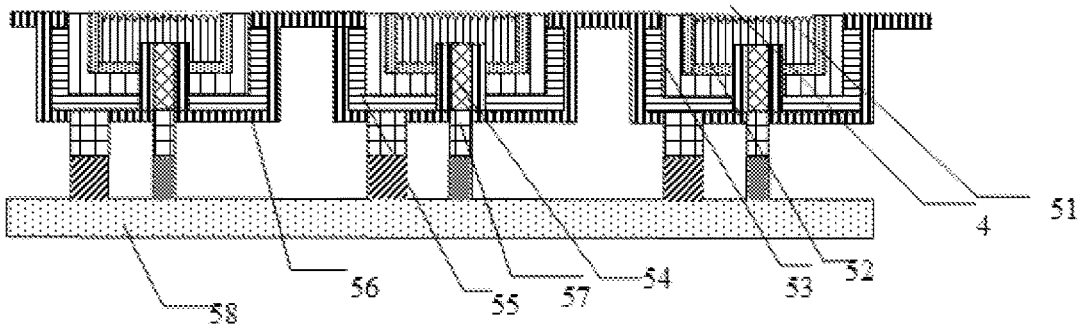
FIG. 17 is a schematic structural diagram of the light-emitting device after peeling according to this application.
Figure 18:
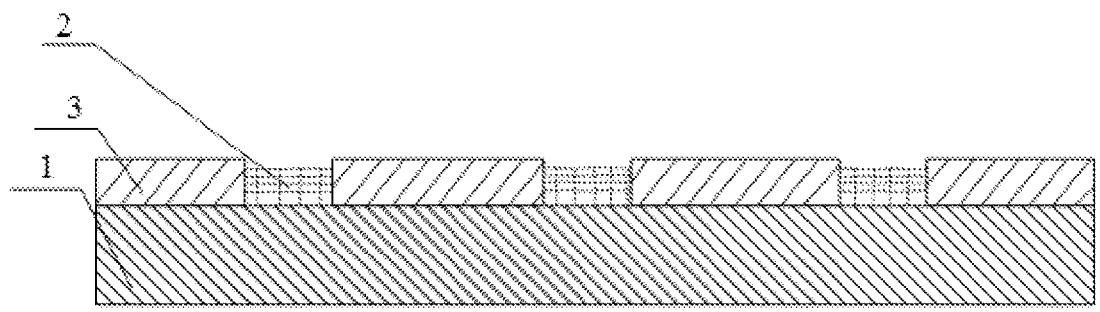
FIG. 18 is a schematic structural diagram of a template of a light-emitting device template that can be reused after the light-emitting device is peeled off according to this application.

In one embodiment, as shown in FIG. 16, a specific implementing method of peeling the plurality of light-emitting units from the mask layer and the GaN-based semiconductor layer may include: removing the plurality of light-emitting units from the mask layer and the GaN-based semiconductor layer by peeling off the sacrificial layer. The light-emitting device as shown in FIG. 17 and the template of the light-emitting device as shown in FIG. 18 are obtained. The plurality of light-emitting units can be peeled from the template by wet etching the sacrificial layer, which avoids damage to the template and realizes the repeated use of the template. The sacrificial layer can also roughen the surface of the light-emitting device formed after peeling and improve the light extraction efficiency. In one embodiment, when the insulating layer of the plurality of light-emitting units remains on the template after peeling, the insulating layer of the remaining light-emitting units can be removed by etching and cleaning, so as to realize the repeated use of the template.

In this embodiment, the light-emitting device with a horizontal structure is prepared on the template of the light-emitting device. In other embodiments, the light-emitting device with a vertical structure is prepared on the template of the light-emitting device, as shown in FIG. 19*a*-FIG. 19*d*, specifically as follows.

Figure 19A:
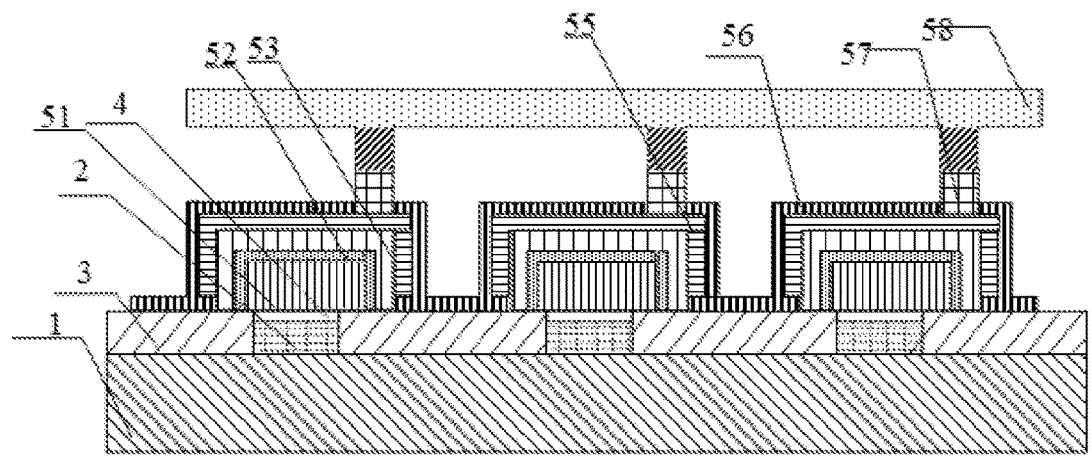
FIG. 19a-FIG. 19d illustrate a preparation process of a vertical light-emitting device.

As shown in FIG. 19*a*, a first semiconductor layer 51, an active layer 52, a second semiconductor layer 53, a mirror metal electrode 55, and an insulating layer 56 are sequentially formed on a mask layer 3 and a sacrificial layer 4 of a template of a light-emitting device. The mirror metal electrode 55 is connected to a drive backplane 58 through electrode contact pads 57. In this embodiment, the electrode contact pads 57 connect the mirror metal electrode 55 with the drive backplane 58. In other embodiments, the electrode contact pads 57 connect the mirror metal electrode 55 with other temporary carriers, as long as the carriers can realize transferring of the light-emitting device, which is not limited in this application.

Figure 19B:
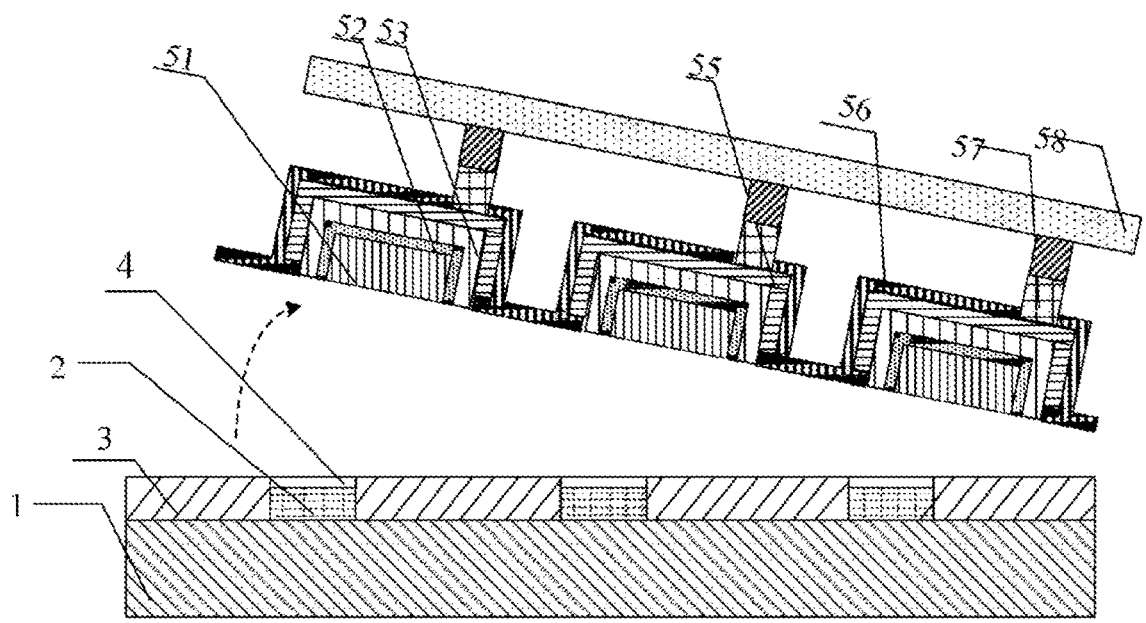

As shown in FIG. 19*b*, the light-emitting device is peeled off from the template of the light-emitting device. In this embodiment, the light-emitting device and the template of the light-emitting device can be separated by wet etching the sacrificial layer or the like.

Figure 19C:
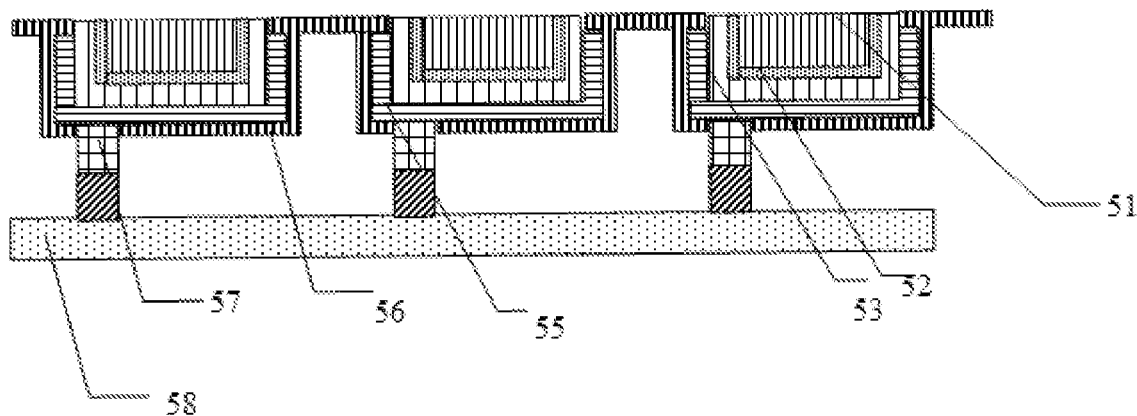

As shown in FIG. 19*c*, the light-emitting device formed as described above is turned over through the drive backplane 58.

Figure 19D:
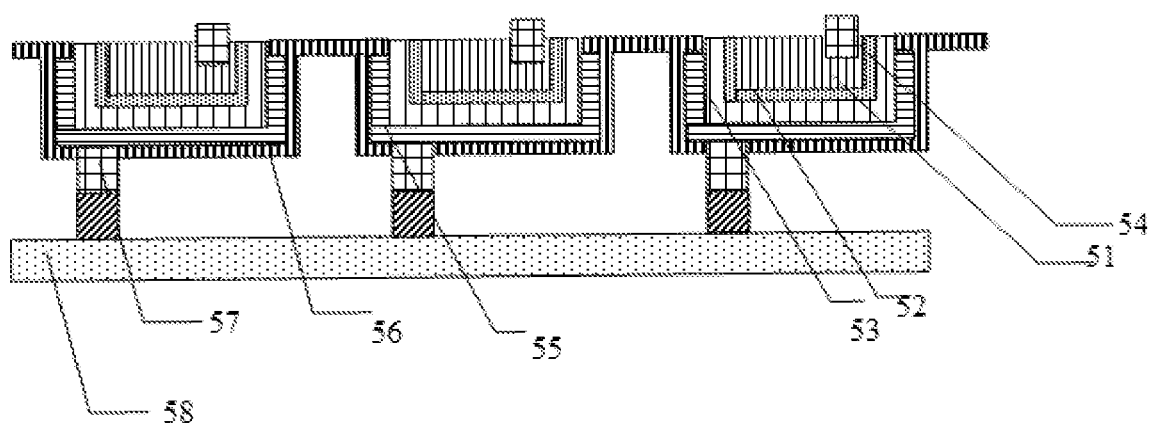

As shown in FIG. 19*d*, an electrode 54 is prepared on the first semiconductor layer 51 of the inverted light-emitting device to form a vertical light-emitting device.

In this application, the template can be reused to avoid waste of materials and reduce costs; the plurality of light-emitting units adopt a selective epitaxy method to avoid non-radiative recombination problems due to etching and improve luminous efficiency. Temporary carriers are used to realize the overall transfer of the light-emitting structure devices, which avoids the transfer of a single light-emitting unit, and reduces the transfer costs. The light-emitting structure device has a tight manufacturing process, including redundant design, which reduces the cost of inspection and repair. The light-emitting device structure is a micro-surface structure, and the plurality of light-emitting units can be provided with multiple colors, which can effectively reduce the full-color manufacturing costs while realizing a full-color design.

The above are only preferred embodiments of this application and are not used to limit the protection scope of this application. Any modification, equivalent replacement, improvement, etc. made within the spirit and principle of this application should be included in the protection scope of this application.

What is claimed is:

1. A template of a light-emitting device, comprising:
   a substrate;
   a GaN-based semiconductor layer and a mask layer provided on the substrate, wherein the mask layer comprises a plurality of mask openings provided at intervals, and the plurality of mask openings are filled with the GaN-based semiconductor layer; and
   a sacrificial layer provided on a surface of the GaN-based semiconductor layer away from the substrate and located in the plurality of mask openings provided at intervals, wherein the sacrificial layer comprises a plurality of hole structures and the light-emitting device is disposed on the sacrificial layer, a height of a side of the sacrificial layer away from the substrate is lower than a height of a side of the mask layer away from the substrate, and the sacrificial layer is configured to be peeled off so that the light-emitting device is peeled off from the mask layer and the GaN-based semiconductor layer.

2. The template according to claim 1, wherein the GaN-based semiconductor layer are further disposed between the substrate and the mask player.

3. The template according to claim 1, wherein a width of each mask opening of the plurality of mask openings is not greater than 300 microns.

4. The template according to claim 1, wherein a transverse cross-sectional shape of the plurality of mask openings comprises a combination of any one or more of the following shapes: hexagon, circle, triangle, rhombus, and rectangle.

5. The template according to claim 1, wherein a material of the mask layer comprises a combination of any one or two of the following materials: silicon dioxide and silicon nitride.

6. A light-emitting device, comprising a template for preparing a plurality of light-emitting units and the plurality of light-emitting units prepared on the template at intervals; wherein the template for preparing the plurality of light-emitting units comprises the template of the light-emitting device according to claim 1, and each of the light-emitting units is formed on one of the plurality of mask openings.

7. The light-emitting device according to claim 6, wherein a minimum width of each light-emitting unit of the plurality of light-emitting units along an arrangement direction is not greater than 300 microns.

8. The light-emitting device according to claim 6, wherein a longitudinal cross-sectional shape of the plurality of light-emitting units comprises a combination of any one or more of the following shapes: rectangle, trapezoid, and triangle.

* * * * *